United States Patent
Ovadia

(10) Patent No.: US 10,503,854 B1
(45) Date of Patent: Dec. 10, 2019

(54) METHOD AND SYSTEM FOR GENERATING VALIDATION TESTS

(71) Applicant: Cadence Design Systems, Inc., San Jose, CA (US)

(72) Inventor: Meir Ovadia, Rosh Ha-Aayin (IL)

(73) Assignee: Cadence Design Systems, Inc., San Jose, CA (US)

( * ) Notice: Subject to any disclaimer, the term of this patent is extended or adjusted under 35 U.S.C. 154(b) by 218 days.

(21) Appl. No.: 15/725,307

(22) Filed: Oct. 5, 2017

(51) Int. Cl.
| | | |
|---|---|---|
| *G06F 17/50* | (2006.01) | |
| *G06F 11/00* | (2006.01) | |
| *G01R 31/00* | (2006.01) | |
| *G06F 11/36* | (2006.01) | |
| *G01R 31/28* | (2006.01) | |
| *G01R 31/317* | (2006.01) | |
| *G01R 31/3181* | (2006.01) | |
| *G06F 11/07* | (2006.01) | |
| *G06F 11/26* | (2006.01) | |

(52) U.S. Cl.
CPC ..... *G06F 17/5045* (2013.01); *G01R 31/2803* (2013.01); *G01R 31/317* (2013.01); *G01R 31/3181* (2013.01); *G06F 11/3672* (2013.01); *G06F 17/5022* (2013.01); *G01R 31/2848* (2013.01); *G06F 11/07* (2013.01); *G06F 11/0793* (2013.01); *G06F 11/26* (2013.01); *G06F 11/36* (2013.01); *G06F 2217/14* (2013.01)

(58) Field of Classification Search
None
See application file for complete search history.

(56) References Cited

U.S. PATENT DOCUMENTS

| | | | | |
|---|---|---|---|---|
| 6,499,132 | B1 * | 12/2002 | Morley | G06F 17/504 714/38.13 |
| 7,770,080 | B2 * | 8/2010 | Blanton | G01R 31/31835 379/14.01 |
| 8,280,688 | B2 * | 10/2012 | Huang | G01R 31/318547 702/185 |
| 9,032,371 | B2 * | 5/2015 | Hansson | G06F 11/3692 714/38.1 |
| 9,316,689 | B2 * | 4/2016 | Hamid | G01R 31/3177 |

(Continued)

OTHER PUBLICATIONS

P. Tafertshofer et al., A SAT_Based Implication Engine for Efficient ATPG, Equivalence Checking, and Optimization of Netlists, 1997 IEEE, pp. 648-655. (Year: 1997).*

(Continued)

*Primary Examiner* — Leigh M Garbowski
(74) *Attorney, Agent, or Firm* — Pearl Cohen Zedek Latzer Baratz LLP

(57) ABSTRACT

A method for generating a validation test, may include obtaining, using a processor, a validated scenario for generating a test for a verification model, the validated scenario represented in the form of a directed acyclic graph with a plurality of actions as nodes of the graph. The method may also include analyzing, using the processor, the graph to identify an action of said plurality of actions designed to be executed on a thread that is associated with a faulty scheduler of a verification model to be tested. The method may further include, upon identifying the identified action, amending, using the processor, the verified scenario by removing the identified action from the graph.

19 Claims, 7 Drawing Sheets

(56) References Cited

U.S. PATENT DOCUMENTS

2018/0024192 A1* 1/2018 Sinha .............. G01R 31/31835
714/738

OTHER PUBLICATIONS

A. Calvagna et al., A Formal Logic Approach to Constrained Combinatorial Testing, J Autom Reasoning, vol. 45, Springer, pp. 331-358. (Year: 2008).*
Y.-C. Chen et al., "Fast Detection of Node Mergers Using Logic Implications," 2009 IEEE/ACM Int'l Conference on Computer-Aided Design Digest of Technical Papers, pp. 785-788. (Year: 2009).*
Y.-C. Chen et al., "Fast Node Merging with Don't Cares Using Logic Implications," IEEE Trans. on Computer-Aided Design of Integrated Circuits and Systems, vol. 29, No. 11, Nov. 2010, pp. 1827-1832. (Year: 2010).*
A. Gargantini, "Dealing with Constraints in Boolean Expression Testing," 2011 Fourth Int'l Conference on Software Testing, Verification adn Validation Workshops, IEEE Computer Society, pp. 322-327. (Year: 2011).*
A. Bandyopadhyay et al., "Tester Feedback Driven Fault Localization," 2012 IEEE Fifth International Conference on Software Testing, Verification and Validation, IEEE Computer Society, pp. 41-50. (Year: 2012).*
Y.-C. Chen et al., "SAT-based Complete Logic Implication with Application to Logic Optimization," 2014 IEEE, 4 pages. (Year: 2014).*
S. Sripada et al., "A Timing Graph Based Approach to Mode Merging," ACM/DAC 2015, 6 pages. (Year: 2015).*

* cited by examiner

METHOD AND SYSTEM FOR GENERATING VALIDATION TESTS

FIELD OF THE INVENTION

The present invention relates to system testing. More specifically, the present invention relates to a method and system for generating a validation test, facilitating reuse of validation tests on a validation model with a known or suspected fault.

BACKGROUND

Design verification is a common process for testing a newly designed integrated circuit, board, or system-level architecture, to, for example, confirm that it complies with the requirements defined by the specification of the architecture for that device. Design verification for a device under test (DUT) may be performed on the actual device, but can usually be a simulation model of the device is tested.

Verification of electronic designs typically has three forms. At an early stage, before the electronic design is implemented in hardware, simulation can be conducted on a model of the design. Another form can be emulation, in which one electronic hardware is used to mimic the behavior of another (tested) electronic hardware. At more advanced stages of design development a system on chip can be validated, in a process which is typically referred to as post-silicon validation. Post-silicon validation can be a last stage in the electronic design development, for example, before it is manufactured.

Post-silicon validation tests can be carried out on actual devices running at speed on realistic system boards, the results of which can be assessed by a logic analyzer and other validation tools.

SUMMARY

There is thus provided, according to some embodiments of the present invention, a method for generating a validation test. The method includes obtaining, using a processor, a validated scenario for generating a test for a verification model, the validated scenario represented in the form of a directed acyclic graph with a plurality of actions as nodes of the graph. The method also includes analyzing, using the processor, the graph to identify an action of said plurality of actions designed to be executed on a thread that is associated with a faulty scheduler of a verification model to be tested. The method includes, upon identifying the identified action, amending, using the processor, the verified scenario by removing the identified action from the graph.

According to some embodiments of the invention, the method further includes using the processor, generating a test using the amended validated scenario.

In some embodiments, the method further includes, using the processor, determining whether the identified was in between two actions along a topological order, and if so, connecting the two actions in the graph by a directed edge.

According to some embodiments the method also includes, using the processor, determining whether the identified action was a first action or a last action on the graph, and if so replacing the removed identified action by a fiction action.

In some embodiments the method further includes, using the processor, determining whether the identified action was designed to produce a resource which a later consumer action of said plurality of actions on the graph is designed to use that resource, and if so discarding the verified scenario.

In some embodiments the method further includes receiving information on the faulty scheduler.

According to some embodiments of the present invention, there is provided a non-transitory computer readable storage medium for generating a validation test, having stored thereon instructions that when executed by a processor will cause the processor to obtain using a processor a validated scenario for generating a test for a verification model, the validated scenario represented in the form of a directed acyclic graph with a plurality of actions as nodes of the graph; to analyze, using the processor, the graph to identify an action of said plurality of actions designed to be executed on a thread that is associated with a faulty scheduler of a verification model to be tested; and, upon identifying the identified action, to amend using the processor the verified scenario by removing the identified action from the graph.

In some embodiments, there is provided a system for generating a validation test. The system includes a memory and a processor configured to: obtain a validated scenario for generating a test for a verification model, the validated scenario represented in the form of a directed acyclic graph with a plurality of actions as nodes of the graph; analyze the graph to identify an action of said plurality of actions designed to be executed on a thread that is associated with a faulty scheduler of a verification model to be tested; and upon identifying the identified action, amend the verified scenario by removing the identified action from the graph.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS OF THE INVENTION

Figure 1:
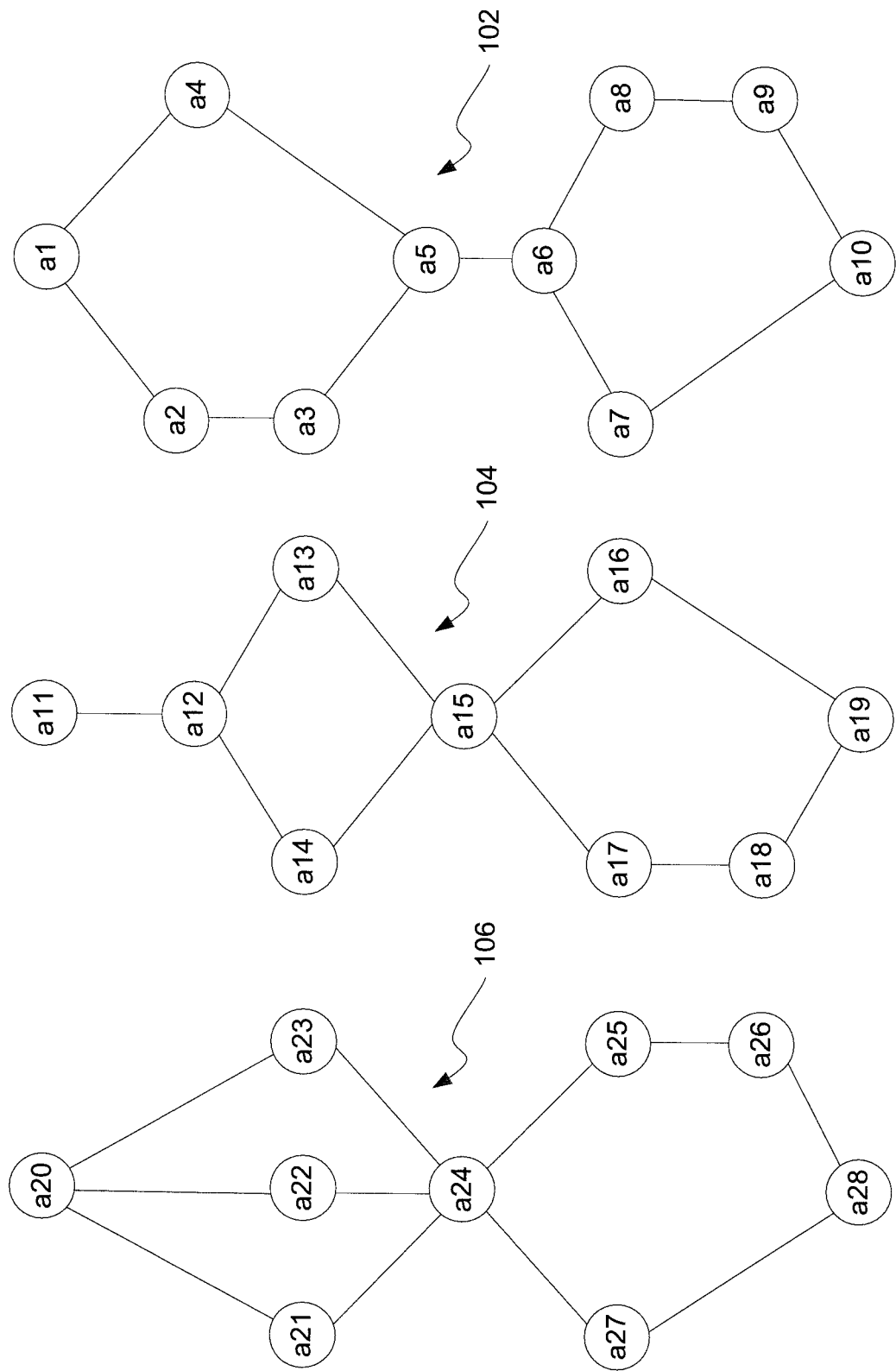
FIG. 1 shows three validated scenarios that were originally constructed for use in verification of a specific verification model of a DUT, according to some embodiments of the invention.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Hereinafter some embodiments of the invention are described with reference is made to a "design under test" or "DUT", by way of example, but it should be understood that some embodiments of the present invention may be implemented on a model presentation of the DUT (hereinafter—verification model).

A scenario may include, for example, a set of actions put together by a validation expert (hereinafter—"user") that is to be tested on the DUT. A valid scenario may be converted into a test (converted to executable code, such as, for example, C-code or Assembly).

An electronic system (e.g., a smartphone) may typically be made up of a plurality of electronic devices (e.g., memory, camera, central processing unit—CPU, graphical processing unit—GPU, microphone, media player, etc.). At the early stages in the development of electronic design, a model of each of the electronic devices that form the electronic system can be built (typically in Verilog or other HDL language and verified, by simulating executions of a multitude of tests on the simulation of the device under test (DUT). In order to, for example, efficiently cover all (or substantially all) functionalities of the DUT a plurality of tests can be generated. The plurality of tests can be pieces of code. e.g., C-code, assembly, and/or other codes as are known in the art. Each of the plurality of tests can be generated from one of various scenarios which can be constructed by a one or a plurality of users. Each scenario can be made up of a plurality of actions which the user selects to be included in the scenario. The user may also define the order in which the selected actions are to be performed—consecutively or concurrently.

An electronic design automation (EDA) tool may allow a user to construct an abstract scenario by dragging actions (actually symbols of such actions) from a set of available actions into a designated space in a graphical user interface, defining the relations between the selected actions (the order in which they are to be performed—e.g., sequentially or in parallel), and generating a test code from the constructed scenario.

According to some embodiments of the present invention, Validated scenarios (sometimes also referred to as "solutions") that were originally designed, for example, for simulation or emulation, may be transformed into tests and reused, by the same validation professional at various times, by other development professionals or development teams, on the same validation model, other validation model of the same DUT, or other validation model. Such approach may facilitate minimal effort from the user who can utilize scenarios that were originally constructed for a specific verification model of a DUT in validation of another model (e.g., other model of the same DUT).

FIG. 1 illustrates three examples, 102, 104 and 106, of validated scenarios that were originally constructed for use in verification of a specific DUT verification model, according to some embodiments of the invention.

Scenarios may be constructed by verification experts to include a plurality of actions (a1, a2, a3, etc.) which are to be used for testing a DUT. The actions in a scenario can be arranged in an order, as illustrated in the graph representation of the scenario, in which the actions can be performed. Validated scenarios may typically be presented in a directed acyclic graph (DAG) form, where the actions are nodes on the graph. In a DAG actions are typically ordered in a topological ordering, where actions are connected by directed edges, directing from an earlier action a later action, so that the actions are executed consecutively, for example, a1-a2-a3-a5 (in scenario 102), while some action sequences can be arranged to be executed concurrently, such as, for example, a12-a13-a15 and a12-a14-a15 in scenario 104.

Typically, in a development process of an electronic chip under design, many groups of technology experts may work on various aspects of a DUT. For example, one group of experts may focus on the design itself—writing and testing algorithmic logic for the DUT. Another group of experts may focus on the electrical structure—planning and testing the electrical features and characteristics of the DUT. A third group of experts may focus on various physical considerations that should be considered in planning a silicon chip. There may be many more groups who focus on the same or other aspects of the DUT. Typically, these groups of experts use simulations to test their design. However, ever so often, these groups advance at different pace.

In other cases, experts of the same group work on testing and verifying a specific design, but advance at a different pace.

Reuse of a test that was previously generated and used (e.g., by an expert or a group of experts), for a specific DUT may be useful in validation testing by another expert or group of experts, for their work on that DUT. Such reuse may have many advantages, some of which include, for example, reducing time spent on generating tests, reducing time wasted on invalid tests, or on ineffective tests (e.g., tests with low coverage grading), identifying and using "good" tests that have high coverage grading, and so on.

However, in certain situations, a simulated model of a DUT which is being tested by one expert, or one group of experts, may contain a faulty component (e.g., a faulty scheduler—processor, core, etc.), while the model of that DUT that was tested by other expert or group of experts did not include that same fault. The test expert may be aware of the fault, yet may wish to continue testing the DUT before addressing the fault. However, using a test that includes actions that are designed to be executed on a thread associated with that faulty component are likely to return errors when executed on the faulty DUT model.

One solution for this may be to discard tests that include actions that are to be executed on the faulty component. However, this may lead to discarding a vast amount of tests.

Some embodiments of the present invention seek to provide a way to keep some (in some instances, a substantial number) if not all of these tests and reuse them. According to some embodiments of the present invention, an EDA tool—an application, software or hardware (or a combination), may be configured to obtain validation tests, analyze the tests and identify tests that have one or more actions that are to be executed on a thread associated with a scheduler known or suspected to be faulty, which is likely to result in an error when these one or more actions are executed. According to some embodiments the EDA tool is also configured to amend the identified tests by removing these actions, so as to allow running the amended tests, without addressing the faulty scheduler.

Figure 2B:
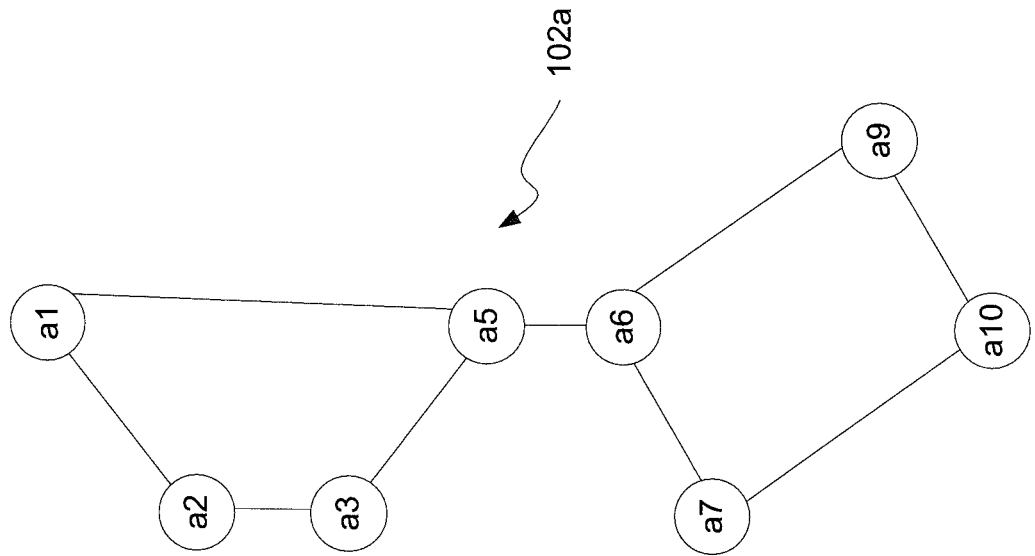
FIG. 2B shows the valid scenario of FIG. 2A after amendment, according to some embodiments of the invention.
Figure 2A:
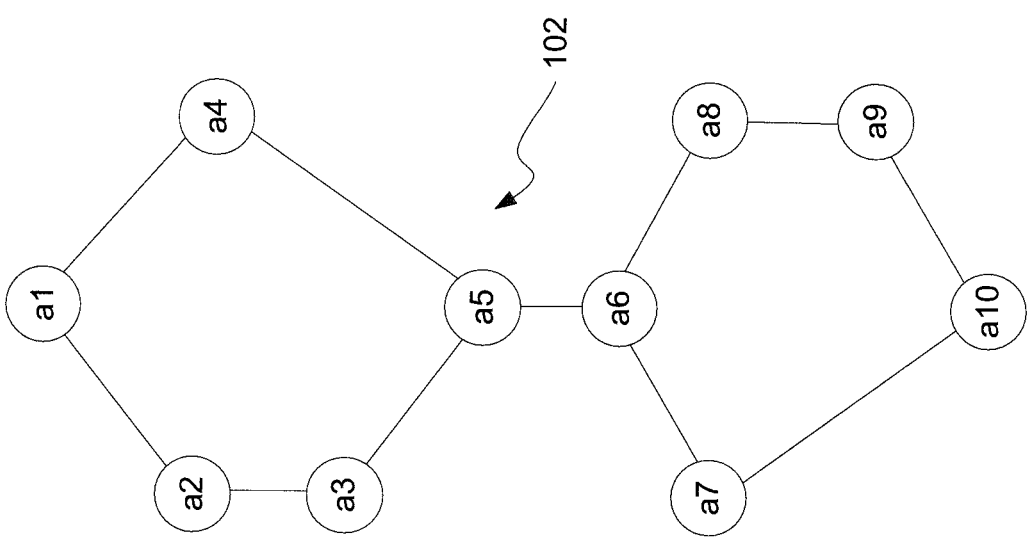
FIG. 2A shows a validated scenario that was originally constructed for testing a specific verification model of a DUT.

For example, consider scenario 102 (FIG. 2A). According to some embodiments of the invention an EDA tool If action a4 and action a8 are identified as actions that are supposed to be executed on a faulty scheduler (e.g., on a processor known or suspected to have a bug), then according to some embodiments of the invention, the EDA tool is configured to automatically remove these actions from the scenario—see the new scenario 102a, without the removed actions, where now action a1 is connected via a directed edge with a5 directly so as to cause action a5 to directly follow action a1 when executed. Similarly, action a6 is connected via a directed edge to action a9 so as to cause action a9 to directly follow action a6 when executed, maintaining the topological order of the remaining actions.

Figure 3B:
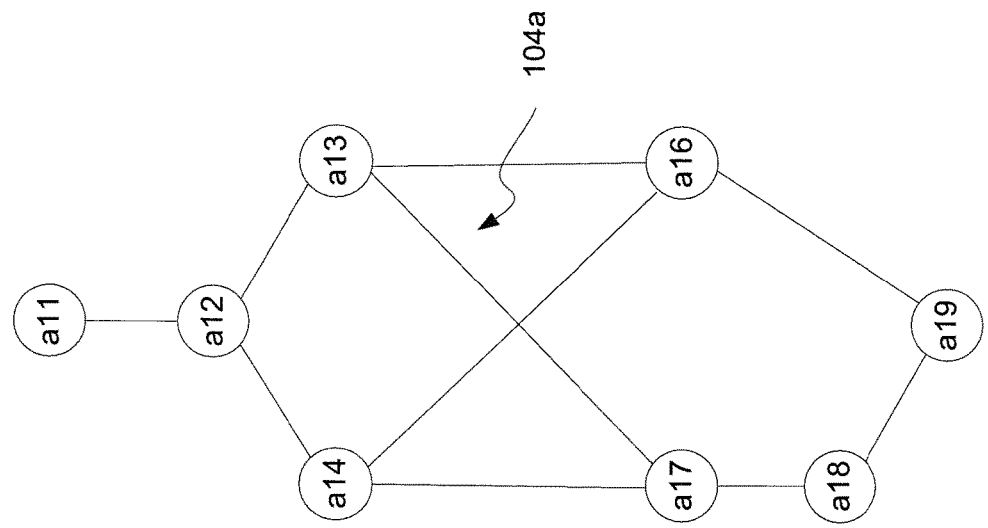
FIG. 3B shows the valid scenario of FIG. 3A after amendment, according to some embodiments of the invention.
Figure 3A:
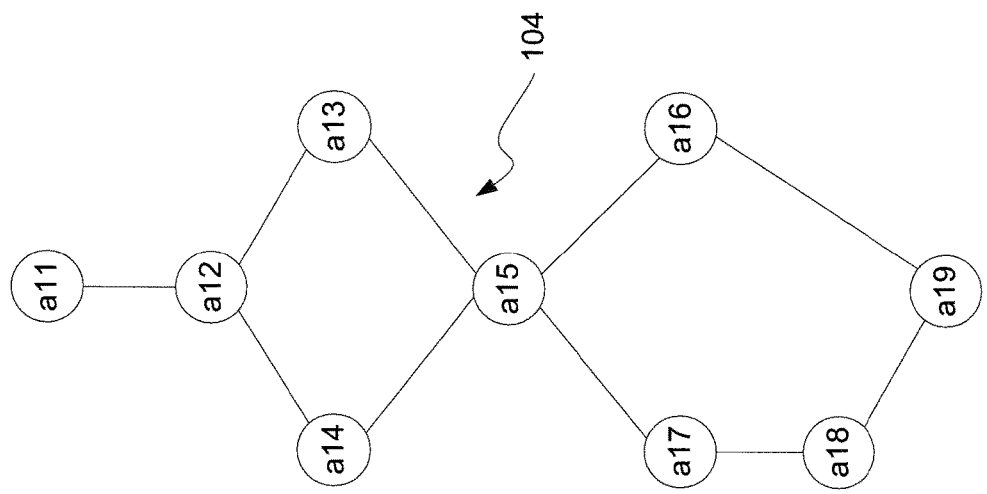
FIG. 3A shows another validated scenario that was originally constructed for testing a DUT.

In another example, scenario 104 (FIG. 3A) may be found to include action a15 that is identified as designed to be executed on a thread associated with a faulty scheduler. According to some embodiments of the invention, the EDA tool automatically removes action a15 from scenario 104 (see scenario 104a, FIG. 3B) and connects directly action a13 to a16 and a17, and also action a14 to action a16 and action a17, maintaining the topological order.

Figure 4A:
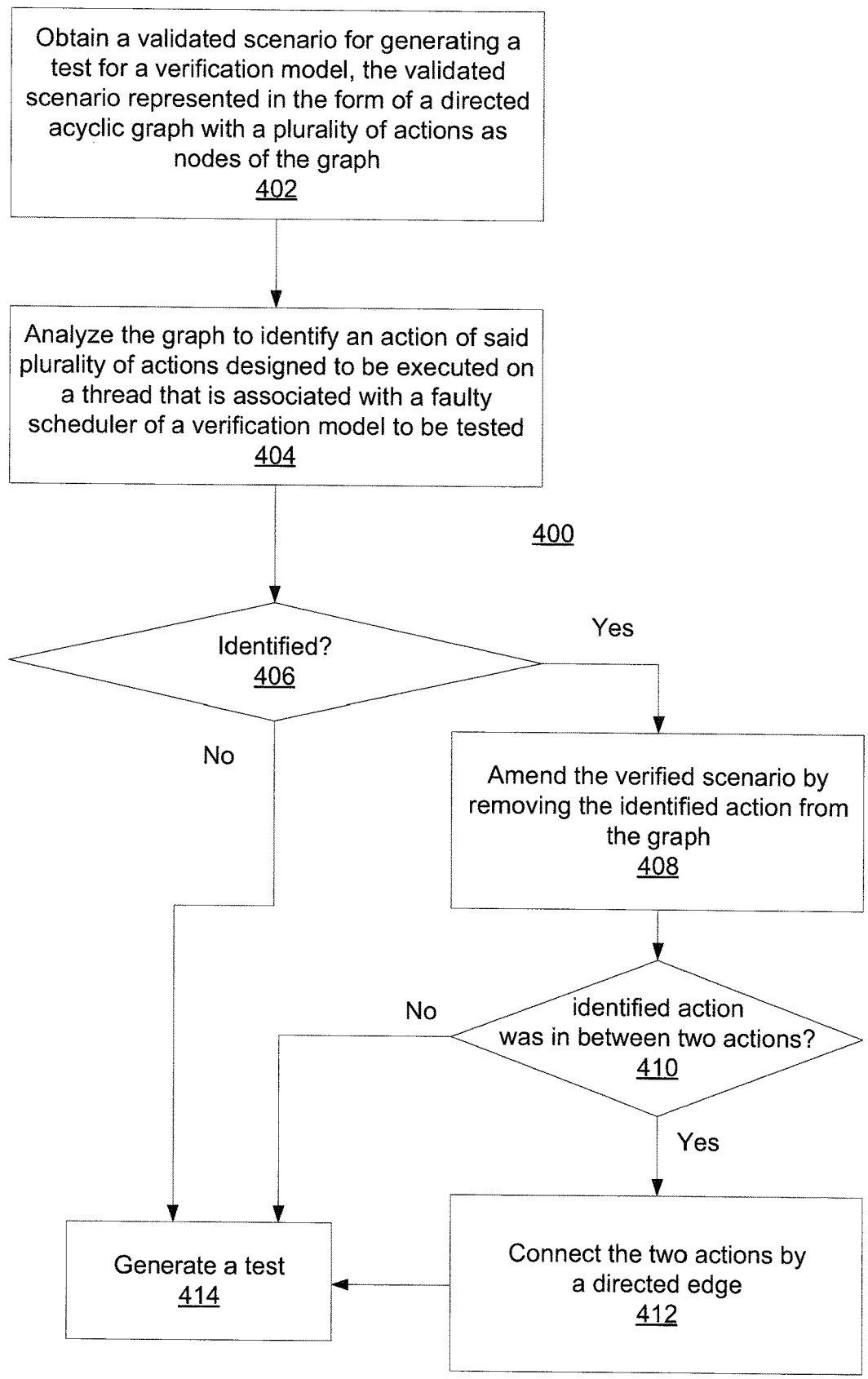
FIG. 4A illustrates a method for facilitating reuse of a validation test on a validation model with a known or suspected fault, according to some embodiments of the invention.

FIG. 4A illustrates a method 400 for facilitating reuse of a validation test on a validation model with a known or suspected fault, according to some embodiments of the invention. Such method may typically to be performed by an EDA tool, which may be implemented in software, hardware or a combination thereof, and using a processor.

Method 400 includes obtaining 402 a validated scenario for generating a test for a verification model, the validated scenario represented in the form of a directed acyclic graph with a plurality of actions as nodes of the graph. Method 400 also includes analyzing 404 the graph to identify 406 an action of said plurality of actions designed to be executed on a thread that is associated with a faulty scheduler of a verification model to be tested.

If such action is not identified, then the EDA tool may generate 414 a validation test code for testing the verification model.

If such action is identified, then the EDA tool may amend the verified scenario by removing 408 the identified action from the graph. If the EDA tool determines 410 that the removed action was not in between two actions along a topological order, then the EDA tool may generate 414 a test code. If the EDA tool determines 410 that the removed action was in between two actions along a topological order, then the EDA tool may connect 412 the two actions by a directed edge.

According to some embodiments of the invention, if the removed action is a first action in the graph (e.g., there is no earlier action than the removed action), removing it may cause the EDA tool to connect the next action or actions to a "start" symbol, which is not an action but a graphical indicator which is commonly used to indicate the beginning of a graph, and is not a real action. Similarly, if the last action of the graph is removed then the EDA tool may connect the previous action or actions to an "end" symbol, which is not an action but a graphical indicator which commonly serves to identify the end of a graph, and is not a real action.

Figure 3C:
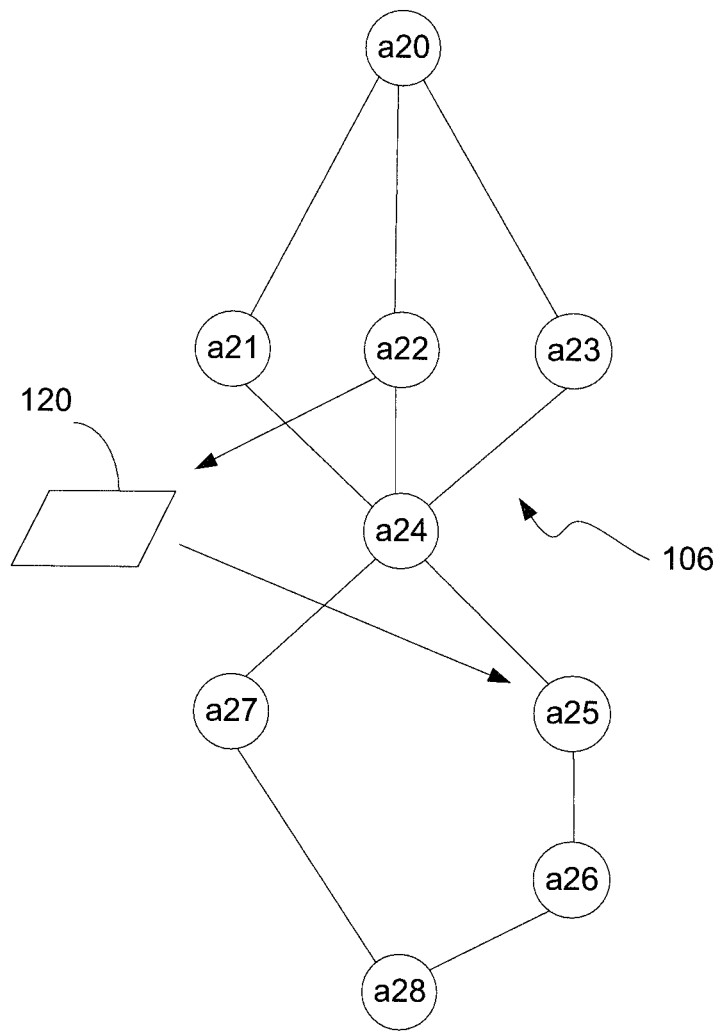
FIG. 3C shows another valid scenario that was originally constructed for testing a DUT.

FIG. 3C shows another valid scenario 106 that was originally constructed for testing a DUT. In this scenario 106 action a22 produces a resource (e.g., writes data 120 into memory), while action a25 down the topological order uses that resource (e.g., reads data 120 that was previously written into memory by action 22.

Figure 4B:
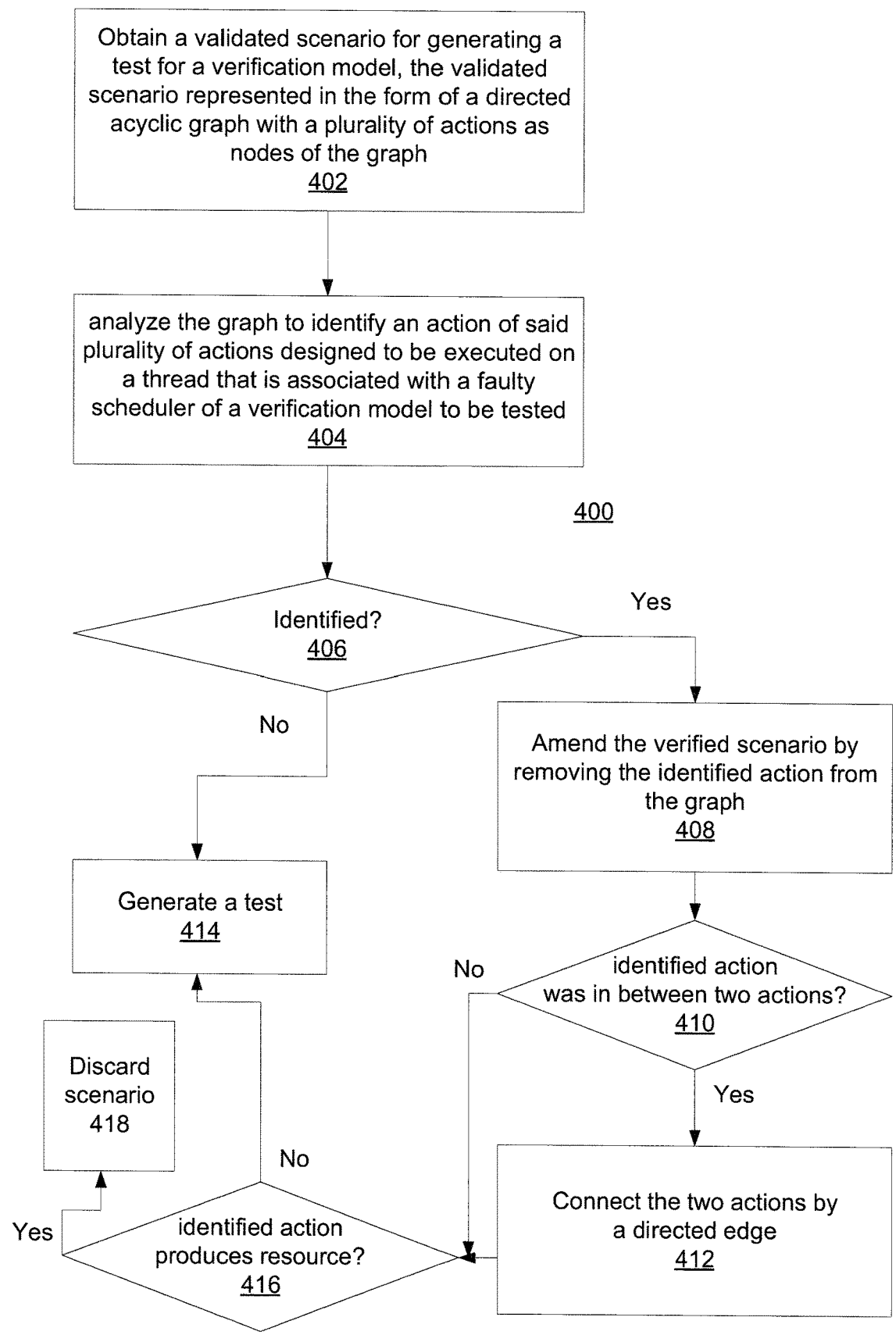
FIG. 4B illustrates method for facilitating reuse of a validation test on a validation model with a known or suspected fault, according to some embodiments of the invention.

FIG. 4B illustrates method for facilitating reuse of a validation test on a validation model with a known or suspected fault, according to some embodiments of the invention, which addresses a case where the identified action is designed to produce a resource which another, later, consumer action is designed to use that resource, along the topological order of the graph, acting as a consumer of the resource.

According to some embodiments of the present invention, if the EDA tool identifies action 22 as an action to be executed on a thread associated with a faulty scheduler, then following the method steps described hereinabove would cause the EDA tool to remove action a22. However, removing action a22 from the scenario is likely to cause an error, as action 25, when executed, cannot read data 120, as it was not written into the memory by action 22. Thus, before generating the test, the EDA tool may determine 416 whether the removed action is configured to produce a resource, which is needed by a later consumer action in the graph.

If the removed action is not designed to produce a resource that is later needed by a later consumer action of the graph, then the EDA tool may proceed to generate 414 the test code. However, if the removed action is designed to produce a resource and a later action on the graph is determined to need that resource, then the EDA tool may discard 418 the scenario (e.g., scenario 106) and not use it for generating a test.

In some embodiments of the present invention, the EDA tool may receive via an input device, information relating to the faulty scheduler from a user. This information may be, for example, identification of the faulty scheduler.

In other embodiments of the present invention the identity of the faulty scheduler may be provided to the EDA tool or otherwise become known to the EDA tool.

Figure 5:
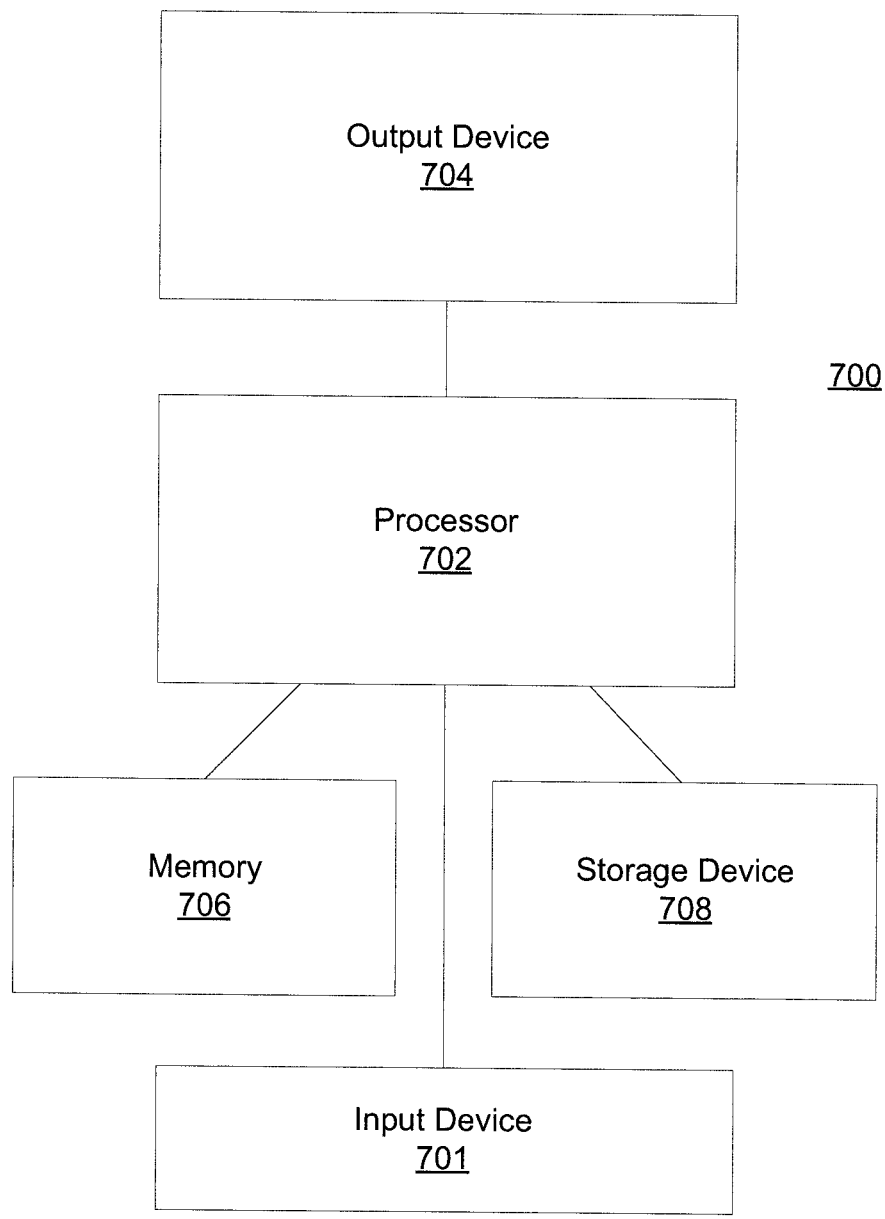
FIG. 5 illustrates a system for facilitating reuse of a validation test on a validation model with a known or suspected fault, according to some embodiments of the invention.

FIG. 5 illustrates a system 700 for facilitating reuse of a validation test on a validation model with a known or suspected fault, according to some embodiments of the present invention. System 700 may include a processor 702 (e.g. single processor or a processing unit made that includes a plurality of processors, on a single machine or distributed on a plurality of machines) for executing a method according to some embodiments of the present invention. Processor 702 may be configured to obtain a validated scenario for generating a test for a verification model, the validated scenario represented in the form of a directed acyclic graph with a plurality of actions as nodes of the graph. Processor 702 may also be configured to analyze the graph to identify an action of said plurality of actions designed to be executed on a thread that is associated with a faulty scheduler of a verification model to be tested. Processor 702 may further be configured to amend the verified scenario by removing the identified action from the graph, and to generate a test code. Processor 702 may also be configured to perform any other method steps according to some embodiments of the present invention.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments of the present invention and corresponding data may be presented. System 700 may also include input device 701, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for amending a validated scenario for generating a validation test, the method comprising:
   obtaining, using a processor, the validated scenario for generating a test for a design under test having a faulty component, the validated scenario represented in the form of a directed acyclic graph with a plurality of actions as nodes of the graph;
   analyzing, using the processor, the graph to identify an action of said plurality of actions designed to be executed on a thread that is associated with the faulty component of the design under test; and
   upon identifying the identified action, using the processor, amending the validated scenario by removing the identified action from the graph to provide an amended validated scenario.

2. The method of claim 1, further comprising, using the processor, generating a test using the amended validated scenario.

3. The method of claim 1, further comprising, using the processor, determining whether the identified action was in between two actions along a topological order, and if so, connecting the two actions in the graph by a directed edge.

4. The method of claim 1, further comprising, using the processor, determining whether the identified action was a first action or a last action on the graph, and if so, replacing the removed identified action by a fiction action.

5. The method of claim 1, further comprising, using the processor, determining whether the identified action produces a resource which is later used by an action of said plurality of actions on the graph, and if so, discarding the validated scenario.

6. The method of claim 1, further comprising receiving information on the faulty component.

7. A non-transitory computer readable storage medium for amending a validated scenario for generating a validation test, having stored thereon instructions that when executed by a processor will cause the processor to:
   obtain, using a processor, the validated scenario for generating a test for a design under test having a faulty component, the validated scenario represented in the form of a directed acyclic graph with a plurality of actions as nodes of the graph;
   analyze, using the processor, the graph to identify an action of said plurality of actions designed to be executed on a thread that is associated with the faulty component of the design under test; and
   upon identifying the identified action, amend, using the processor the validated scenario by removing the identified action from the graph to provide an amended validated scenario.

8. The non-transitory computer readable storage medium of claim 7, wherein the instructions stored thereon when executed by a processor will further cause the processor to generate a test using the amended validated scenario.

9. The non-transitory computer readable storage medium of claim 7, wherein the instructions stored thereon when executed by a processor will further cause the processor to determine whether the identified action was in between two actions along a topological order, and if so, connect the two actions in the graph by a directed edge.

10. The non-transitory computer readable storage medium of claim 7, wherein the instructions stored thereon when executed by a processor will further cause the processor to determine whether the identified action was a first action or a last action on the graph, and if so, replace the removed identified action by a fiction action.

11. The non-transitory computer readable storage medium of claim 7, wherein the instructions stored thereon when executed by a processor will further cause the processor to determine whether the identified action produces a resource which is later used by an action of said plurality of actions on the graph, and if so, discarding the validated scenario.

12. The non-transitory computer readable storage medium of claim 7, wherein the instructions stored thereon when executed by a processor will further cause the processor to receive information on the faulty component.

13. A system for amending a validated scenario for generating a validation test, the system comprising:
   a memory and
   a processor configured to:
      obtain, using a processor, the validated scenario for generating a test for a design under test having a faulty component, the validated scenario represented in the form of a directed acyclic graph with a plurality of actions as nodes of the graph;
      analyze, using the processor, the graph to identify an action of said plurality of actions designed to be executed on a thread that is associated with the faulty component of the design under test; and
      upon identifying the identified action, amend, using the processor the validated scenario by removing the identified action from the graph to provide an amended validated scenario.

14. The system of claim 13, wherein the processor is configured to generate a test using the amended validated scenario.

15. The system of claim 13, wherein the processor is configured to determine whether the identified action was in between two actions along a topological order, and if so, connect the two actions in the graph by a directed edge.

16. The system of claim 13, wherein the processor is configured to determine whether the identified action was a first action or a last action on the graph, and if so, replace the removed identified action by a fiction action.

17. The system of claim 13, wherein the processor is configured to determine whether the identified action produces a resource which is later used by an action of said plurality of actions on the graph, and if so, discarding the validated scenario.

18. The system of claim 13, wherein the processor is configured to receive information on the faulty component.

19. The system of claim 18, further comprising an input device for receiving the information.

* * * * *